United States Patent

Lam et al.

[11] Patent Number: 5,770,876
[45] Date of Patent: Jun. 23, 1998

[54] SEMICONDUCTOR TRENCH CAPACITOR CELL HAVING A BURIED STRAP

[75] Inventors: Chung Hon Lam, Williston; David K. Lord, Colchester; Judith A. Wright, Essex Junction, all of Vt.

[73] Assignee: International Business Machines Corporation, Armonk, N.Y.

[21] Appl. No.: 748,961

[22] Filed: Nov. 13, 1996

Related U.S. Application Data

[60] Continuation of Ser. No. 550,726, Oct. 6, 1995, abandoned, which is a division of Ser. No. 421,115, Apr. 13, 1995, Pat. No. 5,545,583.

[51] Int. Cl.⁶ .................................................. H01L 27/108
[52] U.S. Cl. .......................... 257/301; 257/304; 257/305
[58] Field of Search .................................... 257/296, 301, 257/304

[56] References Cited

U.S. PATENT DOCUMENTS

| | | | |
|---|---|---|---|
| 3,707,656 | 12/1972 | Dewitt | 257/411 |
| 4,801,988 | 1/1989 | Kenney | 357/23 |
| 4,918,502 | 4/1990 | Kaga | 357/23 |
| 4,927,779 | 5/1990 | Dhong et al. | 257/369 |
| 4,988,637 | 1/1991 | Dhong et al. | 437/52 |
| 5,198,995 | 3/1993 | Dennard | 365/149 |
| 5,223,447 | 6/1993 | Lee | 437/47 |
| 5,360,758 | 11/1994 | Bronner et al. | 437/52 |
| 5,363,327 | 11/1994 | Henkles et al. | 257/301 |
| 5,389,559 | 2/1995 | Hsieh et al. | 437/52 |
| 5,395,786 | 3/1995 | Hsu et al. | 437/52 |
| 5,576,566 | 11/1996 | Kenney | 257/301 |

FOREIGN PATENT DOCUMENTS 0335513  12/1993  Japan .................................. 257/301

*Primary Examiner*—Tom Thomas
*Assistant Examiner*—David B. Hardy
*Attorney, Agent, or Firm*—Heslin & Rothenberg, P.C.

[57] ABSTRACT

A semiconductor trench capacitor structure having a first level aligned insulation structure and buried strap that extends from within the trench into the semiconductor substrate. The semiconductor trench capacitor structure may be fabricated by forming a shallow trench extending into both the trench capacitor and the semiconductor substrate, depositing and densifying an insulating material within the shallow trench and using a resist layer to define and etch a strap trench aligned with the wall of the shallow trench, depositing a layer of conductive material within the strap trench and followed by depositing an insulating material therein.

6 Claims, 7 Drawing Sheets

SEMICONDUCTOR TRENCH CAPACITOR CELL HAVING A BURIED STRAP

This application is a continuation of application No. 08/550,726, filed Oct. 6, 1995, now abandoned, which is a division of application Ser. No. 08/421,115, filed Apr. 13, 1995, now U.S. Pat. No. 5,545,583.

FIELD OF THE INVENTION

The present invention relates to a semiconductor trench capacitor cell having a buried strap. More particularly, the present invention relates to a process for fabricating a semiconductor trench capacitor cell with a first level aligned buried strap.

BACKGROUND OF THE INVENTION

Due to the extensive use and broad range of applications of integrated circuits a wide variety of semiconductor memory devices have been developed. These semiconductor memory devices are continuously being applied to new and expanding uses, which in turn require an integrated circuit of increased capabilities and decreased cost. Accordingly, there exists a continuing demand for inexpensive semiconductor devices having increased memory and reduced chip size. Improvements of this nature have been realized in device miniaturization and improved layout and design of semiconductor memory devices.

Many prior art devices utilize recessed oxide (ROX) isolation trenches to separate adjacent trench capacitor cells as a means for preventing electrical interferences (i.e. due to leakage from the channel region of the adjacent memory cell) and parasitic device formation between the trench capacitor and the edge of an active semiconductor region abutting the trench capacitor. Accordingly, when utilizing designs or structures incorporating the ROX isolation trenches, there is a minimum distance (the length of the ROX trench) which must be maintained between the memory cell capacitor and gate electrode of adjacent memory cells in order to avoid electrical interferences and parasitic device formation between the two components. However, the semiconductor substrate area occupied by the ROX isolation trenches is considerable. Thus, a semiconductor device design which avoids or minimizes the use of ROX isolation trenches allows a more densely packed memory array and is, therefore, preferred.

In addition, many memory devices, such as DRAM cells, utilize a dynamic memory cell wherein a bit is represented by a charge stored in a capacitor structure. In DRAM cells the capacitor structure must be coupled with the storage node of the FET. However, due to the already high density of existing semiconductor devices little room is available for surface straps. Moreover, due to the high device density and minimum feature size it is necessary for processing sequences to be compatible with an ever increasing range of structures and materials. For example, contacts are generally formed by etching contact holes in a passivation layer over the areas where the contacts are to be made, followed by depositing a conductive material therein. However, due to the topology of the semiconductor device, formation of the contact holes may often cause damage to other surface structures, such as gate conductors (word lines), or to the passivation layers themselves. It is, therefore, often preferred to provide a buried strap for connecting various regions of the semiconductor device. First, since the strap is buried it leaves more room on the surface of the semiconductor device and, thus, facilitates realization of even higher device densities. Secondly, since the strap contacts are formed at the front end of the integrated process (i.e. prior to formation of many structures) potential damage to other surface structures is obviated.

However, formation of the buried strap at the front end of the initial process requires that it be compatible with processes occurring after formation of the strap. In this regard it is important to note that many trench capacitors and straps are comprised of boron-doped polysilicon, and it is known that boron diffuses quickly in silicon. Subsequent high temperature processing steps can cause boron to diffuse too far into the storage node and cause unwanted activation and interference with an active word line. Thus, diffusion of the boron or other dopants through undoped silicon can eliminate the tight tolerances achieved by utilizing self-aligned structures. Therefore, there likewise exists a need for a contact strap and process for creating the same that is compatible with subsequent processing steps.

There exists a continuing demand for semiconductor memory device designs and processes which utilize fewer processing sequences, while at the same time facilitating greater storage capacity and allowing more densely packed memory arrays. There further exists a need for a trench capacitor structure having a buried strap and isolation structure, both of which are aligned with the trench capacitor structure. There further exists a need for a trench capacitor structure having a buried strap which is compatible with subsequent high temperature processing steps.

SUMMARY OF THE INVENTION

The aforesaid needs are fulfilled and the problems of the prior art overcome by the present invention which in one aspect relates to a semiconductor structure, comprising:

a semiconductor substrate;

a trench capacitor, said trench capacitor having an insulating layer and a conductive material situated therein;

a buried strap recessed below a surface of said semiconductor substrate, said buried strap comprising a contiguous layer of conductive material extending into a section of said semiconductor substrate adjacent said trench capacitor and into a section of said trench capacitor;

an upper insulation layer positioned above said buried strap; and a lower insulation layer positioned beneath and adjacent said buried strap, wherein said upper insulation layer and said lower insulation layer together form a planar surface and wherein a single edge of said buried strap is in electrical contact with said semiconductor substrate and with the conductive material of said trench capacitor.

In a further aspect, the invention relates to a method of producing a semiconductor device having a buried strap, comprising:

forming a first trench in a semiconductor substrate, said trench lined with an insulation layer and having a conductive material therein;

forming a shallow trench extending into said first trench and extending into said semiconductor substrate;

depositing an insulating material within said shallow trench;

removing a region of said insulating material whereby said region defines a strap trench extending over said first trench and said semiconductor substrate;

forming a contiguous layer of conductive material within said strap trench wherein the conductive material lies below the surface of the semiconductor substrate, thereby forming a strap; and forming an insulation layer over said conducting material within said first trench and over said strap.

In a further aspect, the method may further comprise forming a dielectric material over said silicon substrate prior to forming said first trench. In a further aspect, the method may further be characterized by densifying the insulating material within the shallow trench prior to forming the contiguous layer of conductive material within the strap trench. In a further aspect of the invention, the method may be further characterized, wherein the trench wall is defined by an interior wall having an upper and bottom portion and wherein forming an insulation layer on the interior of said trench comprises:

forming a thin insulation layer on the bottom portion of said interior wall; and forming a thick insulation layer on the top portion of said interior wall.

BRIEF DESCRIPTION OF THE DRAWINGS

FIGS. 2b–6b show cross-sectional views taken at A-A$^1$ of a structure created in the fabrication of the trench capacitor cell shown in FIG. 1a and 1b.

FIGS. 8b–11b show cross-sectional views taken at A-A$^1$ of a structure created in the fabrication of the trench capacitor cell shown in FIGS. 12a and 12b.

FIG. 12b shows a cross-sectional view taken at A-A$^1$ of the trench capacitor cell shown in FIG. 12a.

DESCRIPTION OF THE PREFERRED EMBODIMENT

Figure 1A:
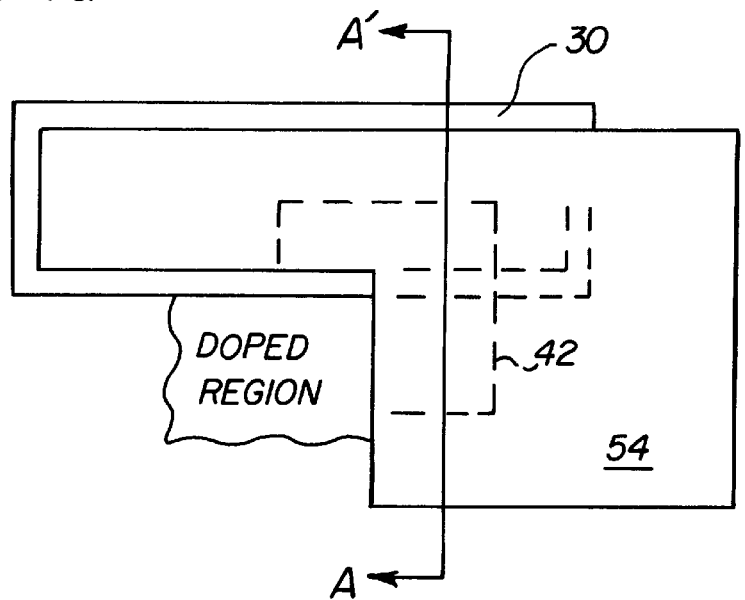
FIG. 1a shows a top view of a trench capacitor cell of a related invention with a buried strap shown in shadow.
Figure 1B:
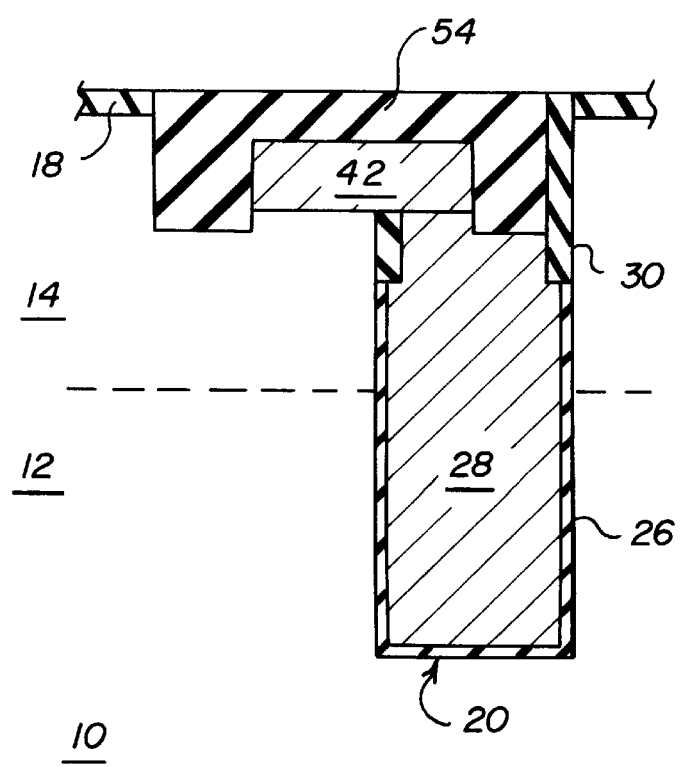
FIG. 1b shows a cross-sectional view of the trench capacitor cell of FIG. 1a taken at A-A$^1$.

A semiconductor memory device of a related invention, an embodiment of which may be seen in reference FIGS. 1a and 1b, may be formed in a composite semiconductor substrate 10 having an N-well 14 formed in a P+ substrate region 12. The semiconductor memory device having a trench capacitor comprising a deep trench 20 having a conductive material fill 28, a thin insulation layer 26 and sidewall defined thick isolation layers 30. The contiguous layer of conductive material 42 forming the buried strap extends from within the deep trench 20 into an active region of the semiconductor substrate 10, thereby coupling the conductive fill 28 of the trench capacitor with the storage node of the FET. A second isolation layer 54 extends over both the conductive material fill 28 within the deep trench and over the top of and at least one side of the buried strap 42.

It should be noted that throughout this specification various aspects of the invention have been shown and schematically represented in a simplified manner in order to more clearly describe and show the present invention. For example, the top views and vertical cross-sections of the trench constructions in the present application have been illustrated as being geometrically shaped, specifically rectangular in shape. However, one skilled in the art will appreciate that with practical semiconductor methods the actual formation of the trench will most likely incorporate more rounded features. Moreover, the scope of the present invention is not intended to be limited to constructions of any particular shape.

Figure 2B:
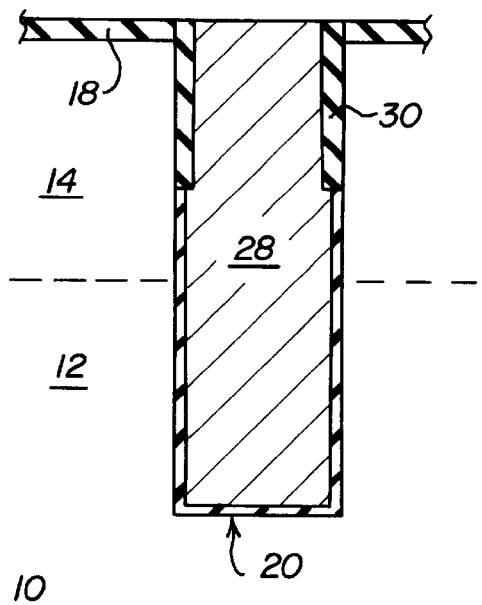
Figure 3A:
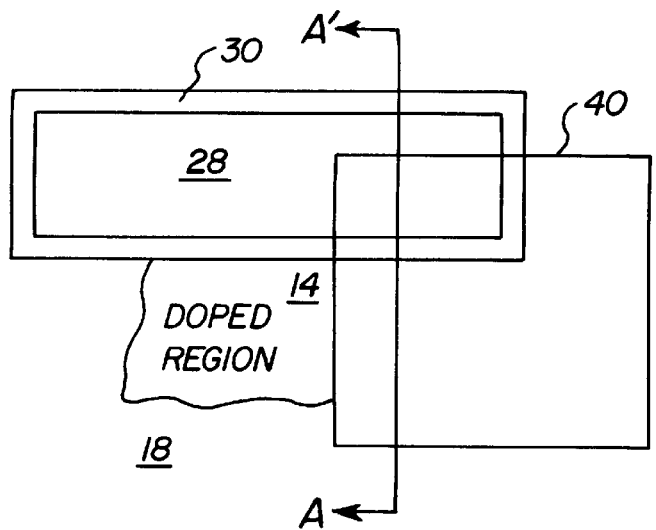
FIGS. 3a and 6a show top views of a structure created in the fabrication of the trench capacitor cell shown in FIG. 1a and 1b and correspond to FIGS. 3b and 6b respectively.
Figure 3B:
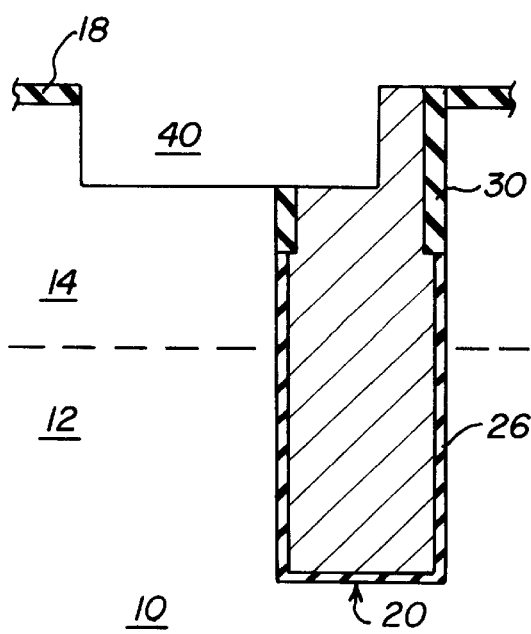
Figure 4B:
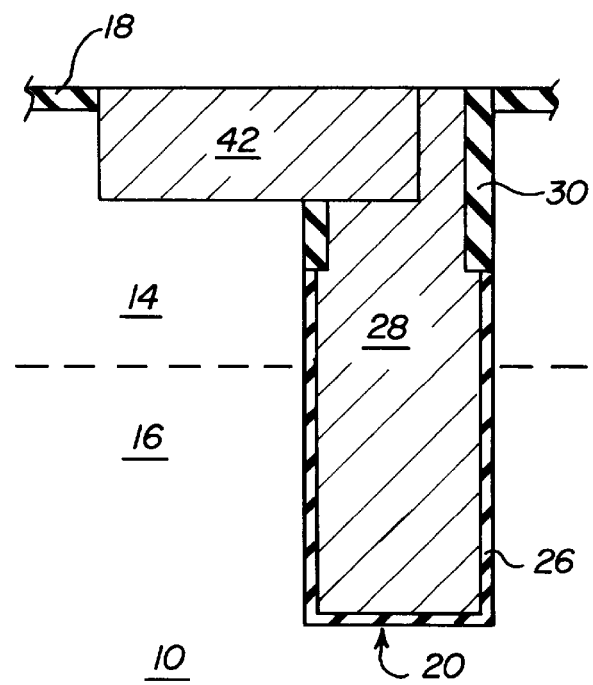

As may be seen in reference to FIGS. 2b–6b, 3a and 6a, illustrations are shown depicting intermediate structures which may be created during fabrication of a semiconductor memory device of the present invention. A semiconductor substrate 10, such as a composite semiconductor substrate is shown in FIG. 2b, having an N-well 14 formed in a P-epitaxical portion over P+ substrate 12. A surface dielectric layer 18 may then be formed conformally over the surface of the semiconductor substrate. This dielectric layer may be formed by any one of several known methods, for example, oxidation growth or chemical vapor deposition. The thin surface dielectric layer over the semiconductor substrate is shown schematically as a single thin insulation layer. However, in a preferred embodiment this insulation layer comprises a composite of dielectric materials, such as a silicon oxide layer and a silicon nitride layer. More preferably, a first silicon oxide layer of approximately 100Å and a second layer of silicon nitride of approximately 1000Å over the oxide.

A masking oxide layer (not shown) may be formed on top of the surface dielectric layer 18 and patterned to allow a deep trench 20 to be formed down into the semiconductor substrate. The deep trench may be formed via methods well known in the art, for example, reactive ion etching (RIE). As may still be seen in reference to FIG. 2b, the trench 20 may be defined by a bottom wall, and a sidewall having an upper sidewall portion and a lower sidewall portion. The upper sidewall portion preferably has a thick isolating layer 30 and the lower sidewall portion a thin insulating layer 26. In a preferred embodiment the upper sidewall portion occupies approximately 10 to 20 percent of the sidewalls, and the lower sidewall portion occupies approximately the lower 80 to 90 percent of the sidewalls. However, it should be noted that these percentages are only exemplary, the present invention being useful with other sidewall arrangements.

After forming the deep trench 20 the thin insulating layer 26 may be formed along the trench sidewalls by methods well known in the art, examples including thermal oxide growth or chemical vapor deposition. Preferably the thin insulating layer has a thickness of 8 to 12 nM. This insulating layer may comprise of common insulating materials, examples including silicon oxide, silicon nitride and combinations thereof. The deep trench 20 may then be filled with a conductive material 28, an example being a P+ doped polysilicon such as boron-doped polysilicon, which facilitates the storage of a charge in a trench capacitor structure.

Thereafter, a portion of the conductive material 28 may be removed from the deep trench 20 in order to expose the upper portion of the trench sidewalls. The point at which the removal is terminated will define the upper and lower trench side wall portions. In a preferred embodiment the polysilicon fill would be left in the lower 80% of the trench. After a portion of the conductive fill 28 has been removed and the upper portions of the trench sidewalls exposed, thick isolating layers 30 may be formed along the trench upper sidewall. These thick isolating layers may be formed by chemical vapor deposition, thermal oxide growth or other means which allows a conformal layer of an insulation material to be applied to the sidewalls. An anisotropic etch (e.g. RIE) may be applied to remove portions of the oxide without removing those portions formed on the sidewalls of the trench. The thick isolating layers may comprise common dielectrics similar to those utilized by the thin insulating layer discussed herein above. In a preferred embodiment, the thick isolating layers formed along the trench upper sidewall portions have a thickness of about 100 to 150 nM. However, the thick isolating layers and the process of forming the same may be omitted if the depth of the recess areas 52 (see FIG. 6B) is sufficiently deep to prevent parasitic device formation as discussed herein below.

Thereafter, a second deposition of conductive fill material 28, such as boron doped polysilicon, may be deposited in the upper portion of the trench adjacent the newly formed thick isolating layers 30. Thereafter, the newly deposited conductive fill 28 may be planarized to form an even plane with the surface dielectric, this may be accomplished by means well known in the art such as by chemical mechanical polishing. The cross section of the resulting structure may be seen with reference to FIG. 2b.

A photolithographic mask (not shown) may be applied, exposed and developed in order to leave exposed a contiguous region overlying a portion of both the deep trench 20 and the adjacent semiconductor region 10. The exposed region may be etched back, such as by RIE (reactive ion etching), thereby forming a shallow trench 40, as may be seen with reference to FIGS. 3a and 3b. Preferably, the shallow trench 40 extends to a depth of approximately the top 50 to 60 percent of the thick isolating layers 30 and does not extend below either the N-well region 14. The shallow trench 40 may extend to a depth approximately 450 nM below silicon surface. A conductive material 42, an example being undoped polysilicon, may then be deposited within the shallow trench 40 after the photolithrographic mask (not shown) has been removed and planarized to remove excess undoped polysilicon and to form an even surface with the dielectric layer. The resulting structure may be seen in FIG. 4b.

Figure 5B:
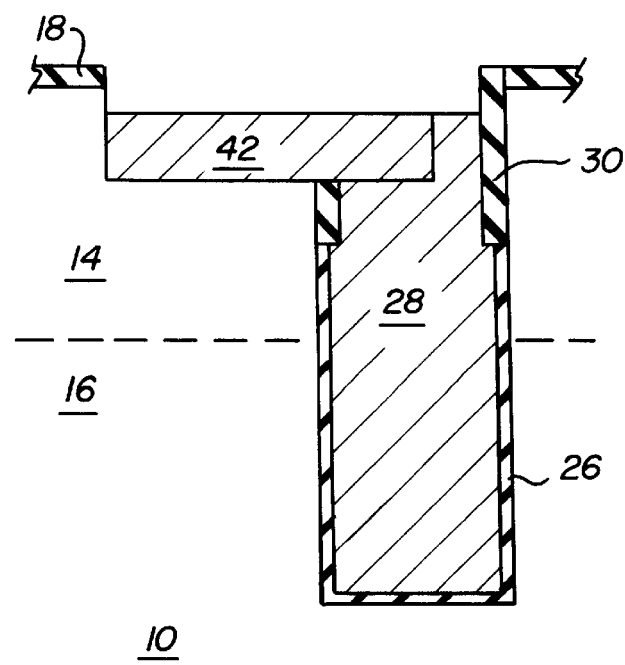

In reference to FIG. 5b, both the doped polysilicon 28 of the deep trench 20 and the undoped polysilicon 42 of the shallow trench 40 may then be recessed below the surface of the semiconductor substrate 10 in order to leave a contiguous layer of the undoped polysilicon 42 in the lower portion of the shallow trench 40. Preferably, the doped polysilicon in the deep trench and the undoped polysilicon in the shallow trench are both etched back to a depth which leaves a layer of undoped polysilicon having a thickness of about 200 nM. Recess may be accomplished by RIE, a timed selective etch which selectively removes silicon relative to the surface dielectric layer 18.

It is preferred that the process utilized to recess the exposed silicon materials be accomplished with a process then selectively recess the silicon relative the surface dielectric layer 18. Such a selective process may include use of an etch that selectively etches silicon (doped and undoped) relative to the surface dielectric layer. In this regard, the surface dielectric layer 18 would act as an etch stop. For example, when the thin surface dielectric layer comprises a thick layer of silicon nitride over a thin layer of silicon oxide a selective nitride:polysilicon etch may be used. Such etches are well known in the art, an example of such a selective silicon etch may use an etch chemistry of F-CL-Br. It will be understood that during this procedure, even when using an etch that selectively etches the polysilicon relative to the surface dielectric layer, a portion of the surface dielectric layer will be consumed in the process. Thus, depending on the selectivity of the particular etch, or other selective process, the amount of the surface dielectric layer which may be consumed will vary. Therefore, the desired thickness of the surface dielectric layer will vary accordingly. The surface dielectric layer should be of a thickness such that the processing will not reduce the thickness of the surface dielectric layer to an extent which allows etching or damage to the underlying semiconductor substrate and electronic elements therein. Utilizing a surface dielectric layer having a thickness of 120 to 160 nM generally provides an acceptable assurance that the surface dielectric layer will prevent unwanted etching or damage to the areas under the surface dielectric layer.

Figure 6A:
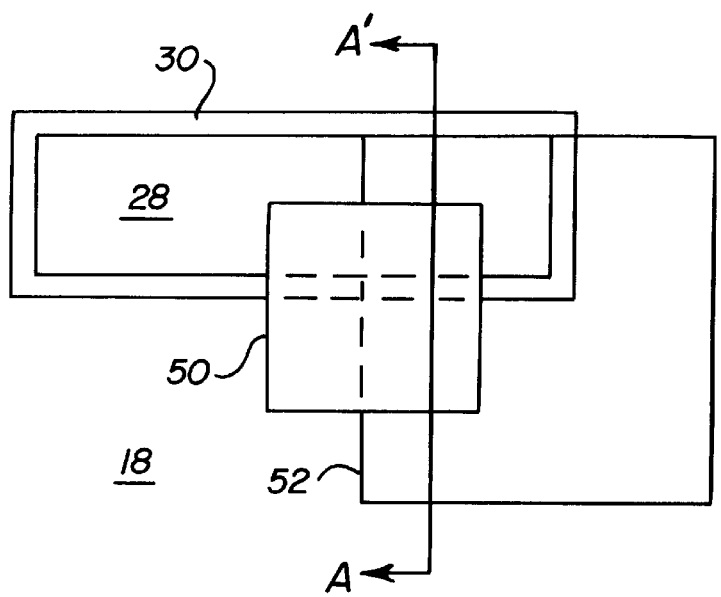
Figure 6B:
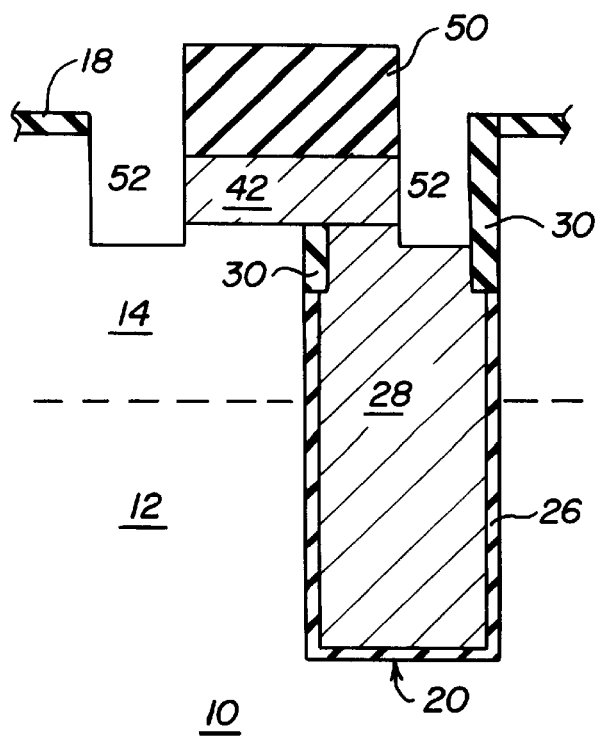

As may be seen with reference to FIGS. 6a and 6b, a resist 50 may be applied over the semiconductor device, exposed and developed to leave a portion of the resist 50 relative to the shallow trench 40 and such that the resist 50 upon the conductive material 42 extends over the semiconductor substrate 10, the thick isolating layer 30 and conductive fill 28 of the deep trench 20. The resist 50 also extends over limited portions of the deep trench 20 and the surface dielectric layer 18 outside the area defined by the shallow trench 40. The polysilicon regions of both the deep trench 20 and the shallow trench 40 which are left unmasked and exposed may then be recessed. It is again preferred that the polysilicon be selectively etched relative of the surface dielectric layer 18. The exposed polysilicon regions may be recessed to a depth beneath the original depth of the shallow trench 40, thereby forming an open recessed area 52. In a preferred embodiment the depth of the recessed areas may be approximately 550 nM below the silicon surface.

Thereafter, as may be seen with reference to FIGS. 1a and 1b, the open recessed area 52 may be filled with an insulating material, thereby forming a second insulation layer 54. Examples of suitable insulation materials include, but are not limited to, silicon oxide, silicon nitride and combinations thereof. A preferred insulator may be formed by depositing TEOS (tetraethoxysilane) by chemical vapor deposition. Thereafter, the insulating material may be planarized by means well known in the art so that the additional insulation forms an even plane with the surface dielectric layer. The undoped polysilicon 42 remaining within the shallow trench 40 forms a buried strap which is in contact with both the conductive fill of the trench capacitor and the storage node of the FET.

Figure 7:
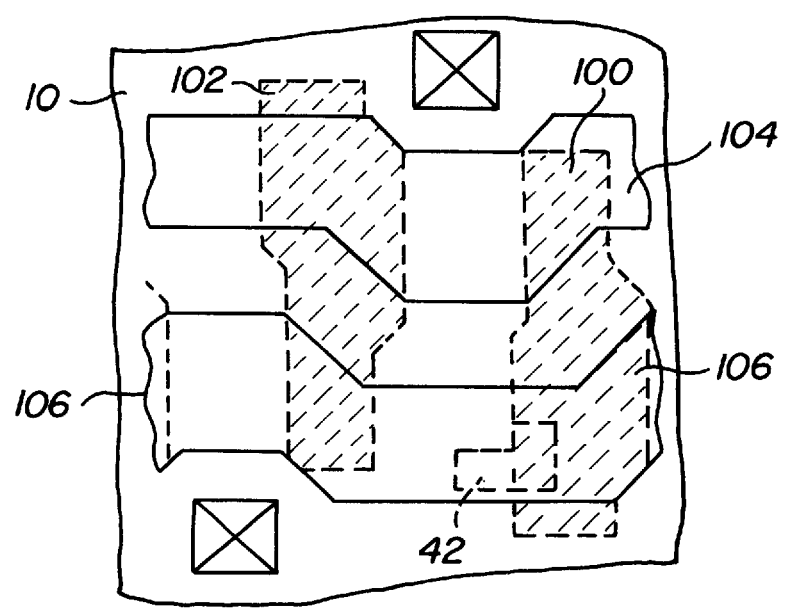
FIG. 7 is a top view of a portion of a semiconductor device showing a memory array design incorporating trench capacitor cells of the present invention.

As may be seen with reference to FIG. 7 utilizing trench capacitor cells as described above enables the array layout to eliminate many ROX regions. The capacitors 100 and 102 may be configured orthogonal to the word lines 104 and 106. The trench spacing may now be a function of defining a space for the source diffusion rather than ROX isolation trenches since the trench capacitors 100 and 102 may abut an active semiconductor region of an adjacent memory cell. The buried strap may extend from within the trench capacitor 100 into an active region of the semiconductor substrate, such as the storage node of a transistor. The transistor may be located under the active wordline 104 and opposite the end of the deep trench 100 housing the buried strap 42. The passing wordline 106 may extend over the buried strap which may be located at the end of the trench away from the active wordline 104.

Often the insulating material used in the second insulation layer 54, such as TEOS, deposited over the buried strap 42 will need to be densified. As used herein a dense oxide may be defined as deposited silicon dioxide with volume density greater than 75% of the volume density of a thermally grown $SiO_2$. This is typically done by heating the oxide to a temperature of about 1050° C. in the presence of $N_2$ for about 1 hour. However, since the dopant, such boron, within the doped polysilicon of the deep trench may quickly diffuse in silicon it is possible that the densification step will cause the boron to diffuse into the undoped polysilicon of the buried strap and from the strap into the semiconductor substrate. Although densification alone typically will not cause the boron to encroach the active wordline device in the semiconductor substrate, subsequent high temperature processing steps coupled with the high temperature densification may often cause this type of diffusion. Thus, depending upon the processing sequences of the semiconductor device utilized subsequent to formation of the buried strap, it may be advantageous to utilize a process that minimizes the diffusion of the dopant in high temperature densification steps since this will allow more freedom to perform other high temperature processing steps subsequent to the formation of the strap.

Figure 8B:
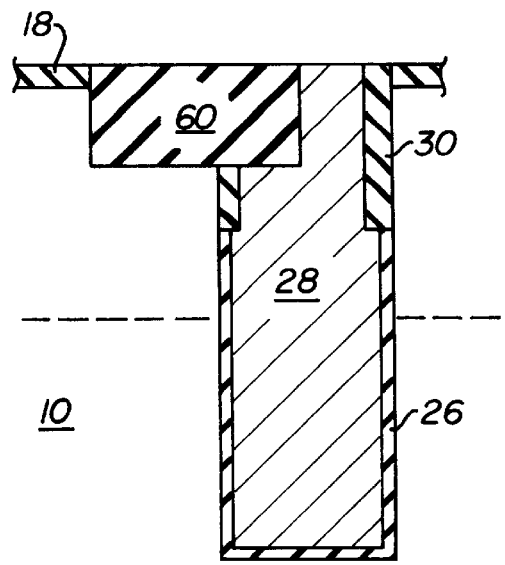

An embodiment of the present invention relates to a process and device that minimizes the extent of boron diffusion caused by an oxide densification step. This process, although similar to the general aspects of the process discussed above, incorporates several variations. A process sequence similar to those discussed above may be utilized to fabricate the structure shown of FIGS. 3a and 3b. However, due to the variations in the process the shallow trench may be etched to a depth of about 550 nM from the silicon surface whereas in the process described above the depth of the shallow trench 40 may generally be recessed to a depth of about 450 nM and the recessed areas 52 to a depth of about 550 nM. Referring to FIG. 8b once the shallow trench 40 has been formed within both the silicon substrate 10 and the deep trench 20, an insulator 60 may be deposited in the shallow trench, an example being chemical vapor deposition (CVD) of TEOS. The insulator 60 may then be planarized, such as by chemical mechanical polishing, to form an even plane with the surface dielectric layer 18. Thereafter, the insulator 60 or oxide may be densified by heating the substrate to a temperature of about 1050° C. in a $N_2$ atmosphere for about 1 hour.

Figure 9B:
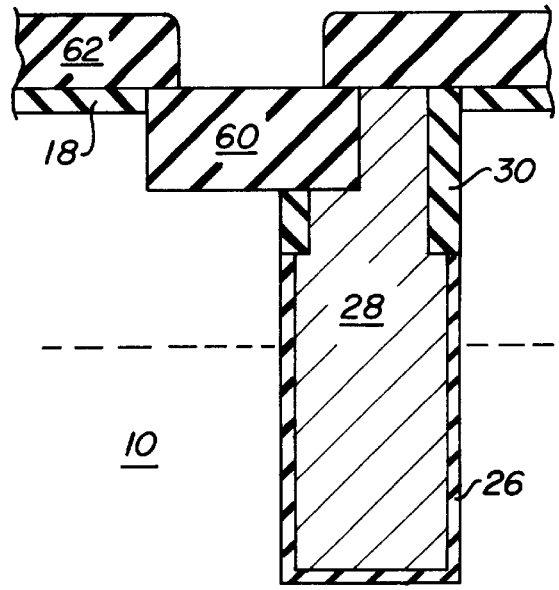
Figure 10B:
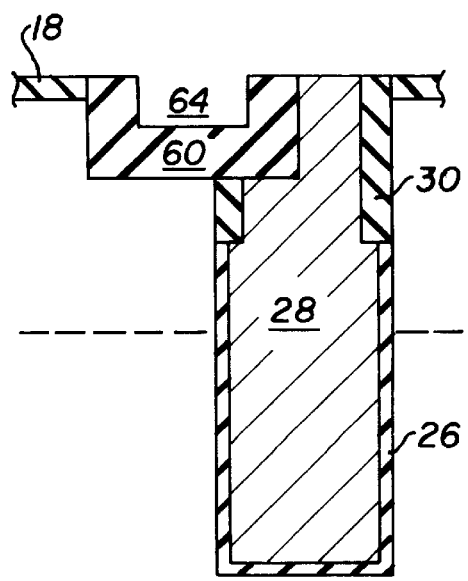
Figure 10A:
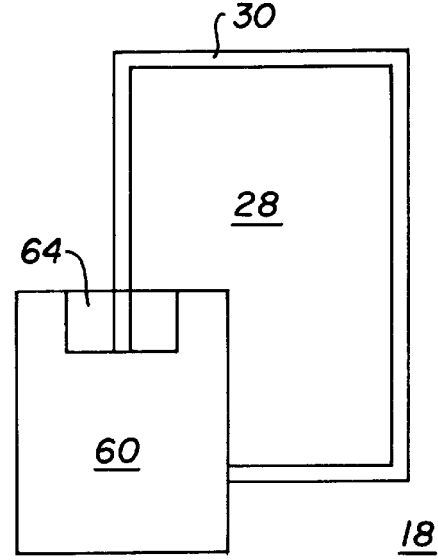
FIG. 10a shows a top view of the structure of FIG. 10b.
Figure 11B:
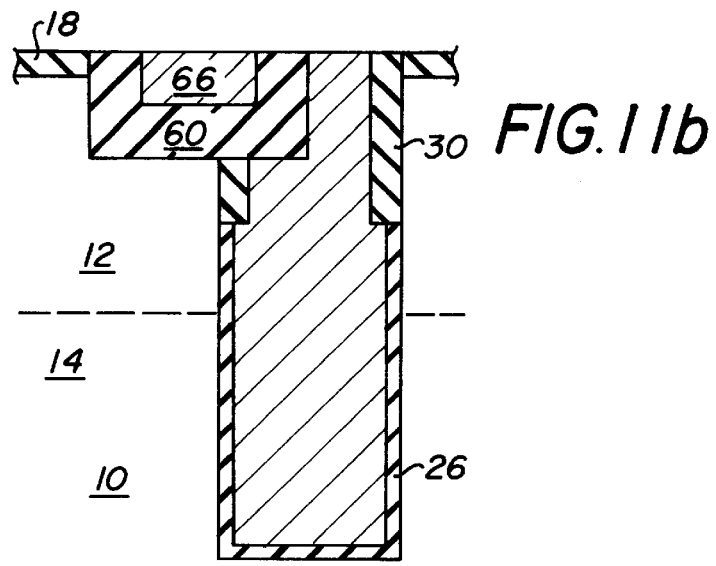
Figure 12B:
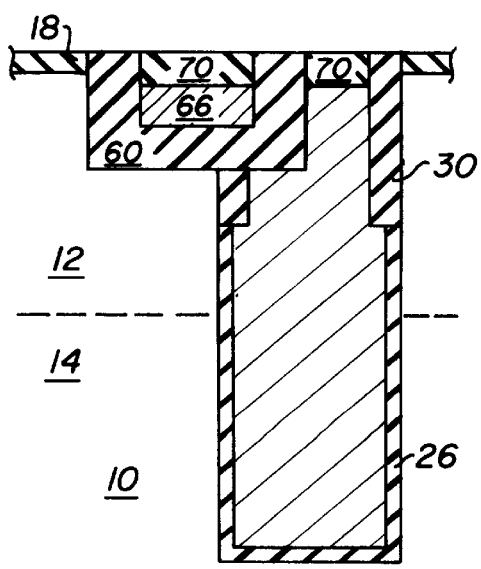
Figure 12A:
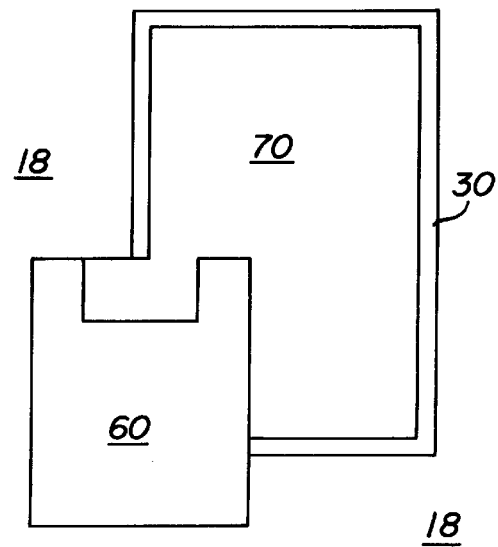
FIG. 12a shows a top view of a trench capacitor cell of the present invention.

In reference to FIG. 9b, after densification of the insulator in the shallow trench 40 a strap resist 62 may be applied over the device. Resists well known in the art, such as photoresists, may be deposited, exposed and developed in order to leave exposed a contiguous region of the insulator 60 within the shallow trench 40 which extends over the deep trench 20, the thick isolating layer 30 of the deep trench and the silicon substrate 10. In reference to FIGS. 6a and 6b, it will be noticed that the region under the strap mask defines the strap whereas in the present embodiment (FIG. 9b) it is the exposed and unmasked area which will eventually define the strap. The exposed region may also include limited portions outside the area defined by the shallow trench 40 such as the surface dielectric layer 18 over the silicon substrate 10 and the conductive fill 28 within the deep trench 20. However, utilization of a process that selectively removes the insulator 60 relative to the surface dielectric layer and polysilicon substantially limits recessing to the exposed insulator 60 within the shallow trench 40. This enables the selective process to define and align the strap trench and ultimately the buried strap, relative to the walls of the shallow trench. The strap trench 64 is formed into and below the surface of the semiconductor substrate, preferably etched into the substrate to a depth of about 450 nM. The resulting structure (absent the strap resist) may be seen in reference to FIGS. 10a and 10b.

The strap mask may be removed and then the strap trench 64 filled with a conductive material 66, an example being undoped polysilicon. The undoped fill 66 may then be recessed, by means similar to those discussed above, to a depth of about 200 nM leaving a strap 66. However, it should be noted that upon removal of the strap resist 62 the doped polysilicon 28 within the deep trench 20 is entirely exposed and it may be recessed simultaneously with the conductive material 66 within the strap trench 64 to a substantially similar depth. It is again preferred to utilize a selective etch that preferentially etches polysilicon relative to the surface dielectric layer 18 in order to prevent unwanted etching or damage to the silicon substrate 10. The silicon within the trench may then be cleaned by methods well known in the art, an example being RCA cleans such as those using $NaOH/H_2O_2$ or $HCL/H_2O_2$. An insulating layer 70, such as silicon oxide, may be deposited over the strap 66 and the doped polysilicon 28 within the deep trench 20. The newly added insulating layer 70 may be densified by a high temperature densification process which is of considerably shorter duration, for example the densification of a TEOS oxide within insulating layer 70 may typically be accomplished by heating the substrate heated to a temperature of 1050° C. in a $N_2$ atmosphere for about 15 minutes. The oxide may then be planarized, such as by CMP, to form a surface substantially planar with that of the surface dielectric layer.

As a result of the aforementioned embodiments of the present invention, a semiconductor trench capacitor cell is furnished having structures formed and first level aligned within the sidewalls of the deep trench. The tolerances associated with fabrication processes have been limited to one mask, namely the mask used to define the shallow trench. The remaining structures being self-aligned with the walls shallow trench. A buried strap is formed which extends within the area utilized by the deep trench and into the storage node of the FET. The insulation needed by the strap is similarly situated and defined, thus facilitating the construction of memory arrays which can be more densely packed. By forming an isolation structure of the present invention which is first level aligned to the trench sidewalls extra chip space that was previously devoted to isolating the trench capacitor from the active semiconductor region of the adjacent memory cell is no longer needed.

While the invention has been particularly shown and described with reference to preferred embodiments thereof, it will be understood by those skilled in the art that other changes in form and details may be made therein without departing from the spirit and scope of the invention.

What is claimed is:

1. A semiconductor structure comprising:
   a semiconductor substrate;
   a trench capacitor, said trench capacitor having an insulating layer and a conductive material situated therein;
   a buried strap recessed below a surface of said semiconductor substrate, said buried strap comprising a contiguous layer of conductive material extending into a section of said semiconductor substrate adjacent said trench capacitor and into a section of said trench capacitor;
   an upper insulation layer positioned above said buried strap; and
   a lower insulation layer positioned beneath and adjacent said buried strap, wherein said upper insulation layer and said lower insulation layer together form a planar surface and wherein a single edge of said buried strap is in electrical contact with said semiconductor substrate and with the conductive material of said trench capacitor.

2. The semiconductor structure of claim 1 wherein the bottom of said lower insulation layer is substantially planar.

3. The semiconductor structure of claim 1 wherein said buried strap comprises undoped polysilicon.

4. The semiconductor structure of claim 1 wherein said insulating material of said upper and lower insulation layers comprises a dense silicon oxide.

5. The semiconductor structure of claim 1 further comprising a dielectric layer over the surface of said semiconductor substrate.

6. The semiconductor structure of claim 5 wherein said dielectric layer comprises a layer of silicon nitride over a layer of silicon oxide.

* * * * *